US012791773B2

(12) United States Patent
Schicketanz

(10) Patent No.: US 12,791,773 B2
(45) Date of Patent: Nov. 10, 2026

(54) PROCESS FOR PRODUCING A REFLECTIVE OPTICAL ELEMENT FOR THE EXTREME ULTRAVIOLET WAVELENGTH RANGE AND REFLECTIVE OPTICAL ELEMENT

(71) Applicant: Carl Zeiss SMT GmbH, Oberkochen (DE)

(72) Inventor: Thomas Schicketanz, Aalen (DE)

(73) Assignee: CARL ZEISS SMT GMBH, Oberkochen (DE)

(*) Notice: Subject to any disclaimer, the term of this patent is extended or adjusted under 35 U.S.C. 154(b) by 402 days.

(21) Appl. No.: 18/467,095

(22) Filed: Sep. 14, 2023

(65) Prior Publication Data

US 2023/0417961 A1 Dec. 28, 2023

Related U.S. Application Data

(63) Continuation of application No. PCT/EP2022/056074, filed on Mar. 9, 2022.

(30) Foreign Application Priority Data

Mar. 15, 2021 (DE) ..................... 10 2021 202 483.1

(51) Int. Cl.
*G02B 5/08* (2006.01)
*B24B 13/00* (2006.01)
(Continued)

(52) U.S. Cl.
CPC ............ *G02B 5/0891* (2013.01); *B24B 13/00* (2013.01); *G03F 7/70958* (2013.01); *G21K 1/062* (2013.01)

(58) Field of Classification Search
None
See application file for complete search history.

(56) References Cited

U.S. PATENT DOCUMENTS 6,441,963 B2 8/2002 Murakami et al.
6,858,537 B2 2/2005 Brewer
(Continued)

FOREIGN PATENT DOCUMENTS

DE 102008042212 A1 4/2010
DE 102015119325 A1 5/2017
(Continued)

OTHER PUBLICATIONS

Taiwan Office Action with English translation, Application No. 111108726, Aug. 13, 2025, 15 pages.
Kloidt et al., "Smoothing of interfaces in ultrathin Mo/Si multilayers by ion bombardment", Thin Solid Films, Elsevier, vol. 228, No. 1-2, May 15, 1993, pp. 154-157.
International Search Report, PCT/EP2022/056074, May 31, 2022, 3 pages.
(Continued)

*Primary Examiner* — Jyotsna V Dabbi
(74) *Attorney, Agent, or Firm* — Edell, Shapiro & Finnan, LLC

(57) ABSTRACT

Production techniques of a reflective optical element for the extreme ultraviolet wavelength range having a multilayer system reflective coating arranged on a substrate. The multilayer system has mutually alternating layers of at least two different materials with different real parts of their refractive indexes at a wavelength in the extreme ultraviolet wavelength range. A layer of one of the at least two materials forms a stack with the layer or layers arranged between the former and the closest layer of the same material with increasing distance from the substrate. At least one layer of the multilayer system is polished during or after deposition thereof, such roughness of the reflective optical element rises significantly less over all layers than in a corresponding reflective optical element with a reflective coating in the form of a multilayer system composed of unpolished layers. The multilayer system may have more than 50 layer stacks.

16 Claims, 9 Drawing Sheets

(51) Int. Cl.
*G03F 7/00* (2006.01)
*G21K 1/06* (2006.01)

(56) References Cited

U.S. PATENT DOCUMENTS

| | | | |
|---|---|---|---|
| 7,382,527 B2 | 6/2008 | Kandaka et al. | |
| 7,511,888 B2 | 3/2009 | Sekine | |
| 8,430,514 B2 | 4/2013 | Von Blanckenhagen | |
| 8,846,146 B2 | 9/2014 | Abelson et al. | |
| 9,190,239 B2 | 11/2015 | Chung et al. | |
| 9,915,873 B2 | 3/2018 | Enkisch et al. | |
| 10,203,435 B2 | 2/2019 | Schicketanz et al. | |
| 10,353,120 B2 | 7/2019 | Kandaka | |
| 2001/0033421 A1 | 10/2001 | Murakami et al. | |
| 2004/0121134 A1 | 6/2004 | Bijerk et al. | |
| 2005/0111083 A1 | 5/2005 | Yakshin et al. | |
| 2007/0281109 A1 | 12/2007 | Bijkerk et al. | |
| 2012/0013976 A1* | 1/2012 | Weber | G02B 5/0816 359/359 |
| 2012/0314281 A1 | 12/2012 | Von Blanckenhagen | |
| 2014/0199543 A1 | 7/2014 | Ehm et al. | |
| 2019/0137861 A1* | 5/2019 | De Groot | G02B 5/021 |
| 2019/0171108 A1 | 6/2019 | Ehm et al. | |
| 2021/0349387 A1 | 11/2021 | Tanabe et al. | |

FOREIGN PATENT DOCUMENTS

| | | |
|---|---|---|
| KR | 20110059771 A | 6/2011 |
| TW | 1822945 B | 11/2023 |

OTHER PUBLICATIONS

German Office Action with English translation, Application No. 10 2021 202 483.1, Sep. 27, 2021, 9 pages.

Kanarik et al., “Atomic Layer Etching: Rethinking the Art of Etch”, The Journal of Physical Chemistry, 2018, pp. 4814-4821.

Ping et al., “Study of chemically assisted ion beam etching of GaN using HCl gas”, Applied Physics, 67 (9), Aug. 28, 1995, pp. 1250-1252.

Gerke, “Bias-plasma assisted RF magnetron sputter deposition of hydrogen-less amorphous silicon”, Energy Procedia 84 (2015) pp. 105-109.

Chason et al., “Kinetis of Surface Roughening and Smoothing During Ion Sputtering”, Materials Research Society, vol. 317, (1994), pp. 91-102.

Pei et al., “Growth of nanocomposite films: From dynamic roughening to dynamic smoothening”, Acta Materialia 57 (2009), pp. 5156-5164.

Taiwan Office Action with English translation, Application No. 111108726, Mar. 27, 2026, 6 pages.

Chinese Office Action with English translation, Application No. 202280021297.2, Apr. 20, 2026, 22 pages.

European Office Action, Application No. 22 712 561.4, Dec. 4, 2025, 7 pages.

Korean Office Action with English translation, Application No. 10-2023-7034688, May 9, 2026, 9 pages.

* cited by examiner

PROCESS FOR PRODUCING A REFLECTIVE OPTICAL ELEMENT FOR THE EXTREME ULTRAVIOLET WAVELENGTH RANGE AND REFLECTIVE OPTICAL ELEMENT

CROSS REFERENCE TO RELATED APPLICATIONS

This is a Continuation of International Application PCT/EP2022/056074, which has an international filing date of Mar. 9, 2022, and which claims the priority of German Patent Application 10 2021 202 483.1, filed Mar. 15, 2021. The disclosures of both applications are incorporated in their respective entireties into the present Continuation by reference.

FIELD

The techniques of the present disclosure relate to a method of producing a reflective optical element for the extreme ultraviolet wavelength range, having a reflective coating in the form of a multilayer system on a substrate, wherein the multilayer system has mutually alternating layers of at least two different materials with different real parts of their refractive indexes at a wavelength in the extreme ultraviolet wavelength range, wherein a layer of one of the at least two materials forms a stack with the layer or layers arranged between the former and the closest layer of the same material with increasing distance from the substrate. The disclosed techniques also relate to a reflective optical element produced by the disclosed methods.

BACKGROUND

In EUV lithography apparatuses, reflective optical elements for the extreme ultraviolet (EUV) wavelength range (e.g., wavelengths between approximately 5 nm and 20 nm), such as photomasks or mirrors on the basis of multilayer systems, are used for the lithography of semiconductor devices. Since EUV lithography apparatuses generally have a plurality of reflective optical elements, they must have as high a reflectivity as possible to ensure sufficiently high overall reflectivity.

A. Kloidt et al., "Smoothing of interfaces in ultrathin Mo/Si multilayers by ion bombardment", Thin Solid Films, 228 (1993) 154-157 discloses that ion-assisted polishing of layers of a periodic multilayer system in the soft x-ray wavelength range, i.e., between 0.1 nm and 5 nm, after the respective application thereof can lead to an increase in reflectivity. For this purpose, multilayer systems composed of molybdenum and silicon of 22 periods of thickness 2.6 nm were examined.

SUMMARY

An object of the techniques of the present disclosure to provide a reflective optical element having good reflectivity.

This object may be achieved by a method of producing a reflective optical element for the extreme ultraviolet wavelength range, having a reflective coating in the form of a multilayer system on a substrate, wherein the multilayer system has mutually alternating layers of at least two different materials with different real parts of their refractive indexes at a wavelength in the extreme ultraviolet wavelength range, wherein a layer of one of the at least two materials forms a stack with the layer or layers arranged between the former and the closest layer of the same material with increasing distance from the substrate, wherein at least one layer is polished during or after deposition thereof, such that, in the resulting reflective optical element, roughness rises less significantly over all layers than in a corresponding reflective optical element with a reflective coating in the form of a multilayer system composed of unpolished layers, and more than 50 stacks are applied.

It has been found that the polishing of at least one layer and the provision of more than 50 stacks in the multilayer system that forms the reflective coating can achieve an increase in reflectivity compared to a corresponding reflective optical element having a reflective coating in the form of a multilayer system composed of unpolished layers having up to 50 stacks. The individual layers of the multilayer system having optical function may be applied by physical, chemical or physicochemical deposition.

According to some examples of the disclosed techniques, the layer thicknesses are chosen such that the thickness of at least one layer of one of the at least two materials in at least one stack differs by more than 10% from the thickness of the layer of that material in the adjacent stack(s). It has been found that, surprisingly, the increase in reflectivity achievable compared to reflective optical elements having corresponding multilayer systems composed of rough layers can be about one order of magnitude higher than in the case of reflective optical elements composed of layers, the thicknesses of which are constant from stack to stack over the entire multilayer system having optical function within the scope of manufacturing tolerances.

Accordingly, in some examples of the disclosed techniques, at least one layer in each stack is polished in order to obtain an elevated increase in reflectivity. According to other examples, polishing is performed on every single layer in order to obtain a particularly high increase in reflectivity in conjunction with a number of stacks of more than 50 stacks.

With regard to increasing reflectivity in comparison to reflective optical elements having a corresponding multilayer system composed of unpolished layers as a reflective coating with up to 50 stacks, it has been found to be advantageous when 55 to 70 stacks, preferably 60 to 70 stacks, are applied.

According to specific examples, polishing of at least one layer is conducted by ion-assisted polishing, reactive ion-assisted polishing, plasma-assisted polishing, reactive plasma-assisted polishing, bias plasma-assisted polishing, polishing via magnetron atomization with pulsed DC current, or atomic layer polishing. The polishing may be conducted either before, during or after the deposition of the at least one layer. Irrespective of the juncture at which the polishing is performed, any methods are usable, including, for example, ion-assisted polishing (see also U.S. Pat. No. 6,441,963 B2; A. Kloidt et al. (1993), "Smoothing of interfaces in ultrathin Mo/Si multilayers by ion bombardment", Thin Solid Films 228 (1-2), 154 to 157; E. Chason et al. (1993), "Kinetics of Surface Roughening and Smoothing During Ion Sputtering", MRS Proceedings, 317, 91), plasma-assisted polishing (see also DE 10 2015 119 325 A1), reactive ion-assisted polishing (see also Ping, Study of chemically assisted ion beam etching of GaN using HCl gas, Appl. Phys. Lett. 67 (9) 1995 1250), reactive plasma-assisted polishing (see also U.S. Pat. No. 6,858,537 B2), plasma immersion polishing (see also U.S. Pat. No. 9,190,239 B2), bias plasma-assisted polishing (see also S. Gerke et al. (2015), "Bias-plasma Assisted RF Magnetron Sputter Deposition of Hydrogen-less Amorphous Silicon", Energy Procedia 84, 105 to 109), polishing via magnetron atomization with pulsed DC current (see also Y. Pei (2009), "Growth of nanocomposite films: From dynamic roughening to dynamic smoothening", Acta Materialia, 57, 5156-5164), atomic layer polishing (see also U.S. Pat. No. 8,846,146 B2; Keren J. Kanarik, Samantha Tan, and Richard A. Gottscho, Atomic Layer Etching: Rethinking the Art of Etch, The Journal of Physical Chemistry Letters 2018 9 (16), 4814-4821, DOI: 10.1021/acs.jpclett.8b00997). It is optionally also possible to combine two or more polishing methods with one another and, for instance, to conduct them simultaneously or successively.

In other examples of the disclosed techniques, the object may be achieved by a reflective optical element produced by a method as described above.

It has been found that a reflective optical element for the EUV wavelength range produced in such a way may exhibit higher reflectivity compared to a corresponding reflective optical element having a multilayer system composed of unpolished layers as a reflective coating having up to 50 stacks.

In some specific examples, the reflective optical element, in at least one stack, has at least one layer of one of the at least two materials that has a thickness differing by more than 10% from the thickness of the layer of that material in the adjacent stack(s). It has been found that, surprisingly, the achievable increase in reflectivity compared with a corresponding reflective optical element composed of layers having thicknesses that are constant from stack to stack over the entire multilayer system having optical function within the scope of manufacturing tolerances can be about one order of magnitude higher compared to reflective optical elements having corresponding multilayer systems composed of rough layers.

Also in some specific examples, the reflective optical element has two stacks in which the thickness of the layer of one of the at least two materials differs by more than 10% from the thickness of the layer of that material in the respective adjacent stacks. This has the advantage of being producible with good average reflectivity with only slight changes in the coating parameters during the coating operation.

In certain examples, at least half of all stacks of the reflective optical element have at least one thickness of a layer of one of the at least two materials that differs by more than 10% from the thickness of the layer of the corresponding material in the respective adjacent stack(s). It is thus possible to provide reflective optical elements for a wide variety of different applications, especially of the optical type, in a very flexible manner.

According to still other examples, the layers of the multilayer system of the reflective optical element have a constant roughness or a roughness that decreases in the direction facing away from the substrate. It is thus possible to achieve particularly good increases in reflectivity compared to reflective optical elements having multilayer systems composed of unpolished layers and having numbers of stacks up to 50 as a reflective coating. Alternatively, the layers of the multilayer system of the reflective optical system have rising roughness in the direction facing away from the substrate, with a smaller rise in roughness than in the case of a corresponding reflective optical element composed of unpolished layers. This permits some degree of reduction in the demands on the polishing of individual layers, hence enabling reduction in the cost and inconvenience associated with the coating process, and nevertheless the finding of an increase in reflectivity. The rise may be, inter alia, linear, quadratic or exponential.

In certain examples, the reflective optical element has a roughness of not more than 0.2 nm. In the case of roughnesses of 0.2 nm or lower, the reflective optical element may have a significant increase in reflectivity compared to reflective optical elements having higher roughness and a number of stacks of 50 or lower.

In more specific examples, especially examples used in EUV lithography or in wafer or mask inspection systems, the reflective optical element includes molybdenum and silicon as the at least two materials having different real parts of their refractive indexes at a wavelength in the extreme ultraviolet wavelength range.

BRIEF DESCRIPTION OF THE DRAWINGS

The disclosed techniques will be elucidated in detail with reference to working examples. The figures show.

DETAILED DESCRIPTION

Example of the techniques disclosed herein include techniques for producing reflective optical elements for the extreme ultraviolet wavelength range that include a reflective coating in the form of a multilayer system on a substrate. The multilayer system has mutually alternating layers of at least two different materials with different real parts of their refractive indexes at a wavelength in the extreme ultraviolet wavelength range. A layer of one of the at least two materials forms a stack with the layer or layers arranged between the former and the closest layer of the same material with increasing distance from the substrate. In addition to forming the above-described layers and layer stacks, the example method may include the following aspects:

- At least one layer is polished during or after deposition thereof, such that, in the resulting reflective optical element, roughness rises less significantly over all layers than in a corresponding reflective optical element with a reflective coating in the form of a multilayer system composed of unpolished layers.
- More than 50 stacks, preferably 55 to 70 stacks, are applied.

In certain preferred embodiments, the layer thicknesses are chosen such that the thickness of the layer of one of the at least two materials in at least one stack differs by more than 10% from the thickness of the layers of that material in the adjacent stack(s).

Figure 1:
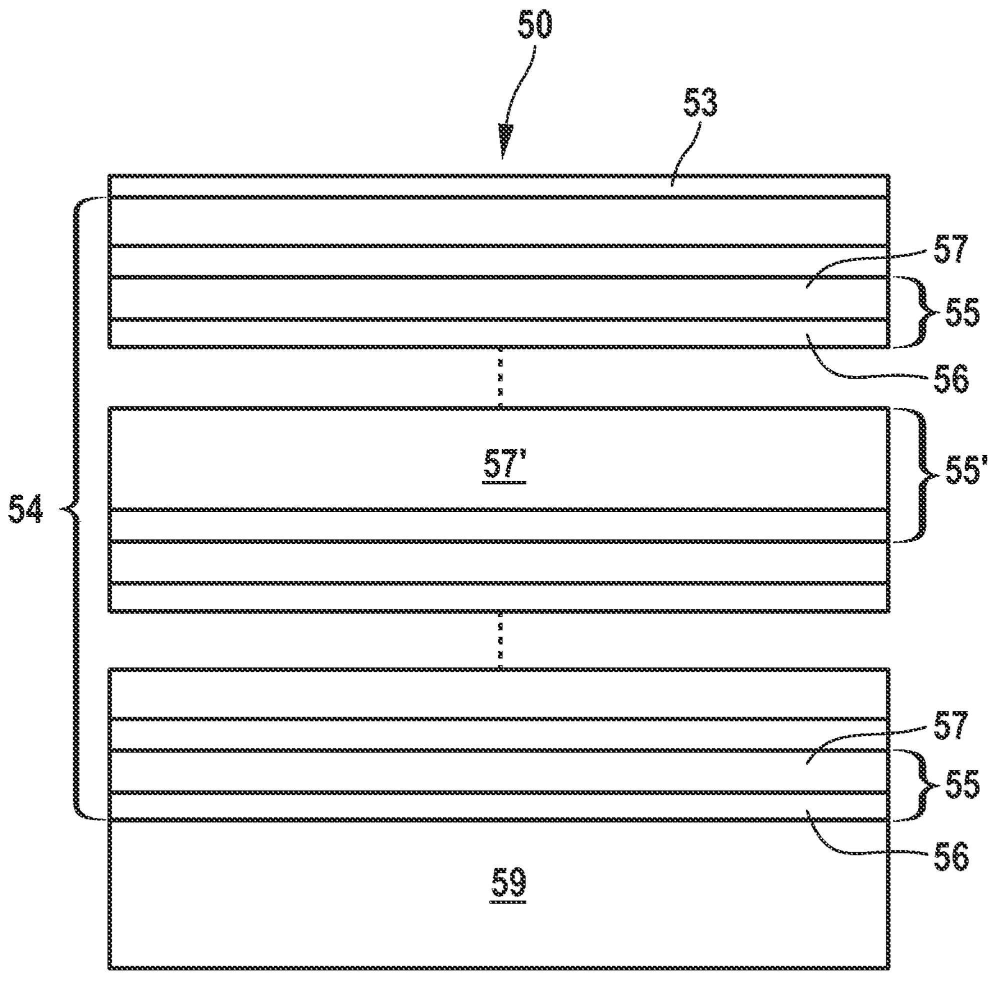
FIG. 1 is a schematic diagram of a first example of a reflective optical element.

FIG. 1 shows a schematic of the construction of a reflective optical element 50 produced in such a way that has, on a substrate 59, a reflective coating in the form of a multilayer system 54 which, in the present example, has layers, applied in an alternating manner to a substrate 59, of a material having a relatively high real part of its refractive index at the operating wavelength at which, for example, a graphic exposure is conducted (also called spacer 57), and of a material having a relatively low real part of its refractive index at the operating wavelength (also called absorber 56), with an absorber-spacer pair forming a stack 55. In a sense, this simulates a crystal, the lattice planes of which correspond to the absorber layers at which Bragg reflection takes place. Typically, reflective optical elements for an EUV lithography apparatus or an optical system are designed such that the respective wavelength of maximum reflectivity substantially coincides with the operating wavelength of the lithography process or of other applications, for instance wafer or mask inspection systems.

The thicknesses of the individual layers 56, 57 and also of the repeating stacks 55 may, in the simplest case, be constant over the entire multilayer system 54 or vary over the area or the total thickness of the multilayer system 54, depending on what spectral or angle-dependent reflection profile or what maximum reflectivity at the operating wavelength is to be achieved. When the layer thicknesses over the entire multilayer system 54 are essentially constant, i.e., constant within the scope of the manufacturing tolerances, reference is also made to a period 55 rather than a stack 55. In certain examples discussed here, the layer thicknesses are chosen such that the thickness of the layer of one of the at least two materials in at least one stack 55' differs by more than 10% from the thickness of the layers of that material in the adjacent stack(s) 55. In the example shown in FIG. 1, apart from one stack 55', all stacks 55 are of a period 55 composed of two layers 56, 57 that each have a constant thickness over the entire thickness of the multilayer system 54. Such stacks may also be referred to as bilayers. In modifications, it is also possible for more than just two layers, each having different material with different complex refractive index at a fixed wavelength in the EUV wavelength range, to be provided in one stack. The stack 55' of different periodicity has a distinctly thicker spacer layer 57' than in the adjoining stacks 55. In variants, the spacer layer may also be chosen so as to be thinner than in the adjacent stacks, or the absorber layer may have a variation in thickness of more than 10% compared to the absorber layers in the adjacent stacks. It is likewise possible for both the spacer layer and the absorber layer or any further layers to have different thicknesses. The example shown in FIG. 1 shows the simplest case that just one stack departs from the periodicity of the other stacks. In further variants, more than one up to all stacks may exhibit different periodicity. In the latter case, there is a fully aperiodic multilayer system. The reflective optical elements, by virtue of their multilayer systems with reduced periodicity that form a reflective coating, have elevated broadband capacity. This means that, at a fixed wavelength of the incident radiation in the EUV wavelength range over a fixed angle range, they have higher average reflectivity than corresponding narrower-band reflective optical elements. At a fixed angle of incidence, they likewise have higher average reflectivity over a fixed wavelength range than corresponding narrower-band reflective optical elements.

The reflection profile of the optical element 50 can also be influenced in a controlled manner by supplementing the basic structure composed of absorber 56 and spacer 57 with further more and less absorbent materials in order to increase the possible maximum reflectivity at the respective operating wavelength. To that end, absorber and/or spacer materials in some stacks can be mutually interchanged, or the stacks can be constructed from more than one absorber and/or spacer material. Furthermore, it is also possible to provide additional layers as diffusion barriers between spacer and absorber layers 57, 56. A material combination that is customary for an operating wavelength of 13.5 nm, for example, is molybdenum as the absorber material and silicon as the spacer material. A period 55 here often has a thickness of approximately 6.7 nm, with the spacer layer 57 usually being thicker than the absorber layer 56. Further customary material combinations include ruthenium/silicon or molybdenum/beryllium. Any diffusion barriers present for protection from interdiffusion may consist of, for example, carbon, boron carbide, silicon nitride, silicon carbide, or of a composition comprising one of these materials. In addition, it is also possible to provide, atop the multilayer system 54, a protective layer 53 that may also have multiple layers, in order to protect the multilayer system 54 from contamination or damage.

Typical substrate materials for reflective optical elements for EUV lithography are silicon, silicon carbide, silicon-infiltrated silicon carbide, quartz glass, titanium-doped quartz glass, glass and glass ceramic. Especially in the case of such substrate materials, it is additionally possible to provide a layer between multilayer system 54 and substrate 59 which is composed of a material having high absorption for radiation in the EUV wavelength range which is used in the operation of the reflective optical element 50 in order to protect the substrate 59 from radiation damage, such as unwanted compaction. Furthermore, the substrate can also be composed of copper, aluminum, a copper alloy, an aluminum alloy or a copper-aluminum alloy. Between substrate 59 and multilayer system 54 having optical function, there may also be one or more layers or layer systems that assume functions other than optical functions, for example compensation or reduction of layer stresses induced in the multilayer system 54 that forms a reflective coating.

In the example reflective optical element 50 of FIG. 1, at least one of the layers 56, 56', 57 has been polished during and/or after application thereof. The layers are applied by any known physical, chemical or physicochemical deposition methods, such as, inter alia, magnetron sputtering, ion beam-assisted sputtering, electron beam evaporation and pulsed laser coating (including PLD (pulsed laser deposition) methods). At least one layer within each stack 55, 55' has preferably been polished. According to specific examples, every single layer has been polished. The polishing may be conducted either before, during or after the deposition of the at least one layer. Depending on at which time the polishing is conducted, it is possible to use any desired methods including, for example, ion-assisted polishing, plasma-assisted polishing, reactive ion-assisted polishing, reactive plasma-assisted polishing, plasma immersion polishing, bias plasma-assisted polishing, polishing via magnetron atomization with pulsed DC current, or atomic layer polishing. It is also possible to combine two or more polishing methods with one another and to, for instance, conduct them simultaneously or successively. In variants, the layers of the multilayer system may have, for example, a constant roughness or one that decreases in the direction facing away from the substrate. In further variants, for instance, the layers of the multilayer system may have a roughness rising in a linear manner in the direction facing away from the substrate, with a smaller rise in roughness than in the case of a corresponding reflective optical element composed of unpolished layers. In yet further variants, for example, the layers of the multilayer system may have a roughness rising in a quadratic manner in the direction facing away from the substrate, with a smaller rise in roughness than in the case of a corresponding reflective optical element composed of unpolished layers.

Some embodiments with different roughness progressions will be described hereinafter by way of example, first with reference to some reflective optical elements having a purely periodic structure, i.e., consisting solely of bilayers. The examples discussed here by way of example are reflective optical elements optimized for a wavelength of 13.5 nm, as used in EUV lithography for instance, and for quasi-normal incidence, i.e., an angle of incidence of roughly 0° to the surface normal. On a substrate composed of silicon, they have bilayers of silicon as a spacer layer and molybdenum as absorber layer, with all bilayers of the respective reflective optical element being identical within the scope of manufacturing accuracy.

Figure 2:
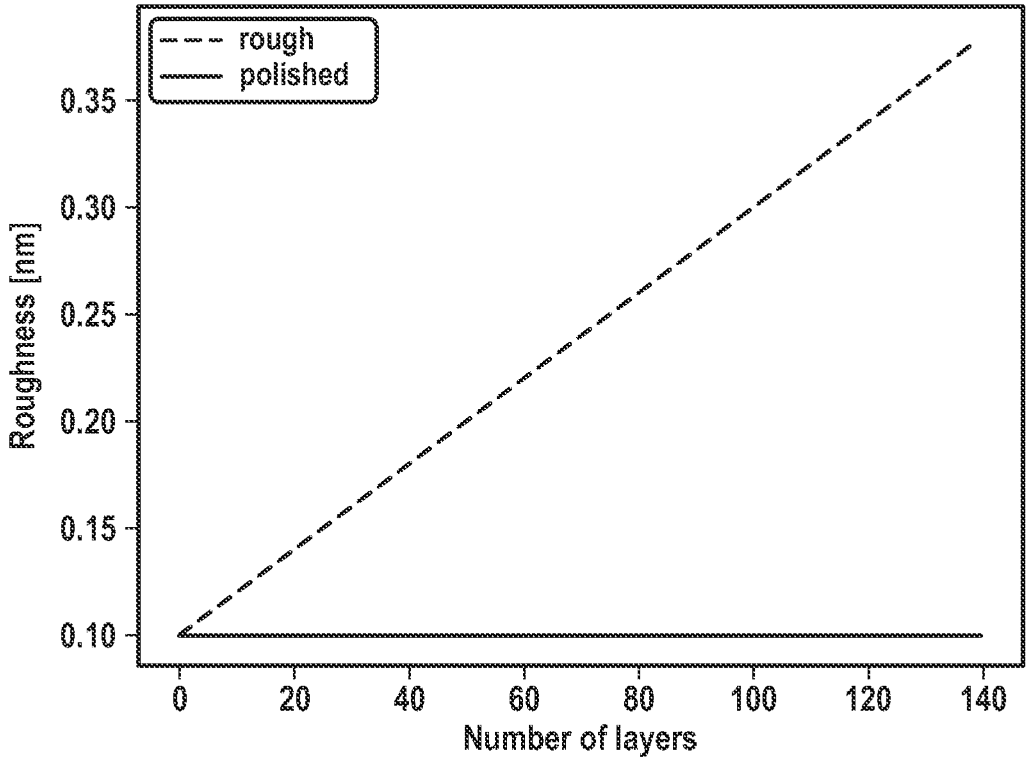
FIG. 2 is a graph illustrating roughness as a function of the number of layers for a first comparative form and a second embodiment of a reflective optical element.

The example shown in FIG. 2 firstly shows reflective optical comparative elements in which roughness at the surface thereof increases in a linear manner with increasing number of layers or number of bilayers counted from the substrate (dotted line). Roughness rises from 0.10 nm on the as yet uncoated substrate surface to a value of almost 0.40 nm when a multilayer system composed of 70 bilayers has been applied on the substrate. The roughness is the rms roughness or root mean square roughness, for which the square of the average variance from the middle line, i.e., the ideal progression of the surface, is ascertained. The local frequency range of relevance for this purpose is 10 nm to 100 μm. By comparison with these rough reflective optical elements, corresponding reflective optical elements are considered, in which, in the example shown here, all layers of the multilayer system have been polished, in such a way that the root mean square roughness remains constant as a function of the number of layers applied (solid line).

Figure 3:
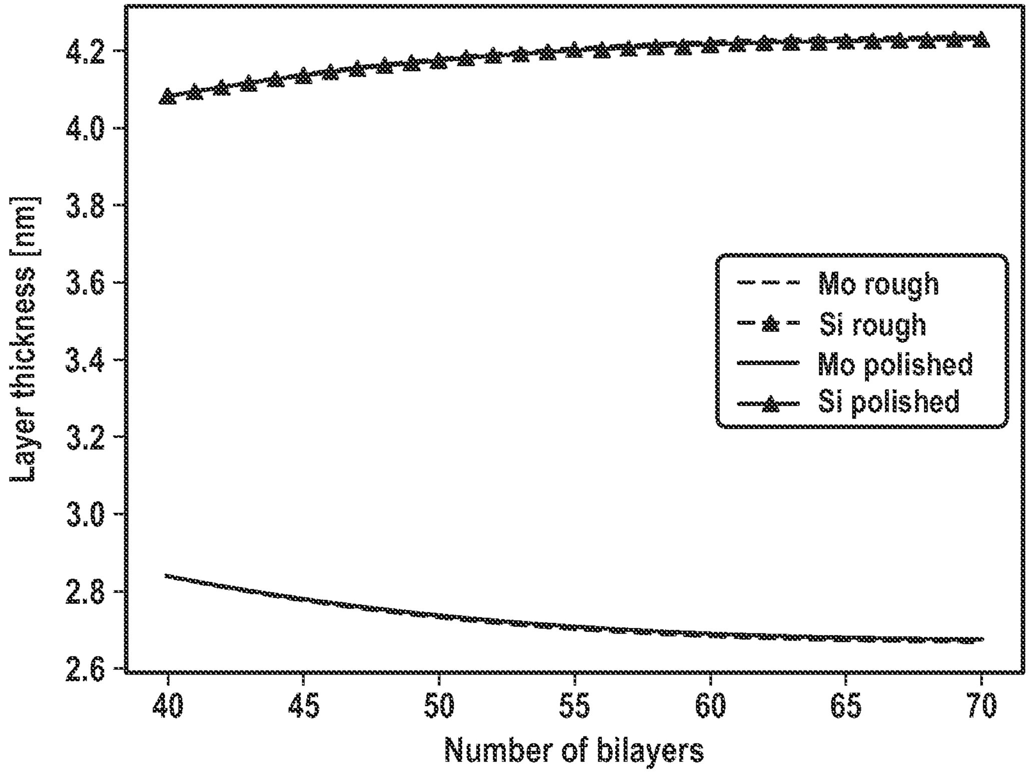
FIG. 3 is graph of the layer thicknesses of variants of the first comparative form and the second embodiment of a reflective optical element depending on the number of bilayers.

What is specifically being compared here with one another are reflective optical elements respectively having 40 to 70 bilayers, the respective layer thicknesses of which have been optimized for maximum reflectivity. The corresponding layer thicknesses are plotted in FIG. 3. With increasing number of bilayers, there is also a slight rise in the spacer thickness, i.e., the thickness of the silicon layer here, and a corresponding fall in the absorber thickness, i.e., the thickness of the molybdenum layer here. This is the case both for reflective optical comparative elements having unpolished layers and for those with polished layers, with effectively no difference in the layer thicknesses for the two cases. The other examples illustrated here also have multilayer systems based on molybdenum and silicon.

Figure 4:
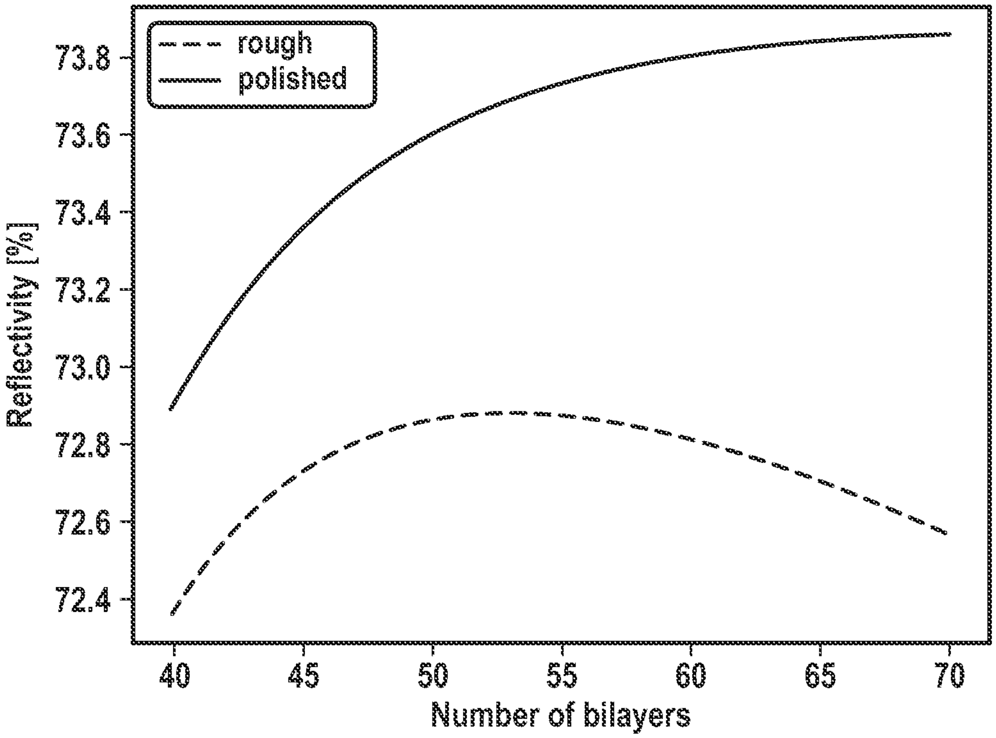
FIG. 4 is a graph of reflectivity of variants of the first comparative form and of the second embodiment of a reflective optical element depending on the number of bilayers.
Figure 5:
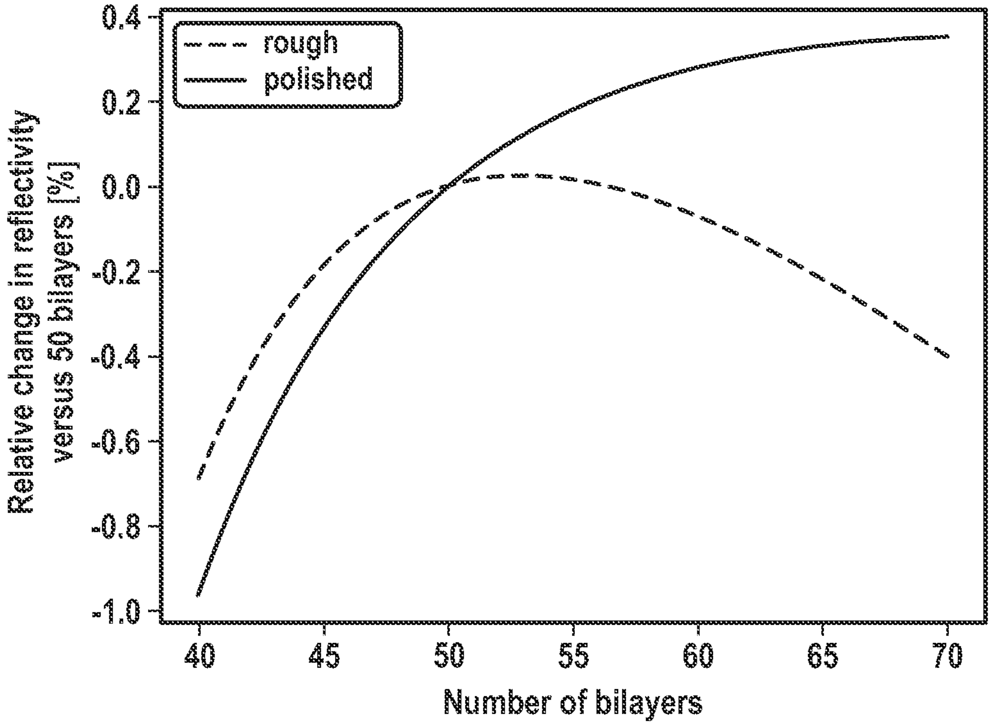
FIG. 5 is a graph illustrating the relative change in reflectivity standardized to the respective variant of the first comparative form and the second embodiment with 50 bilayers.

FIG. 4 shows reflectivity in percent at a wavelength of 13.5 nm and an angle of incidence of virtually 0° as a function of the number of bilayers of the respective reflective optical element, specifically with a solid line for the reflective optical elements with polished layers and a dotted line for those with unpolished layers. In the case of the reflective optical elements with rough unpolished layers, reflectivity has its maximum at about 50 bilayers and falls again with a higher number of bilayers. In the case of the reflective optical elements with polished layers, by contrast, it is surprisingly possible to detect not just a proportional increase in reflectivity which induces a shift in the reflectivity curve with the same progression as a result of the polishing. Especially in the case of more than 50 bilayers, there is a greater than proportional gain in reflectivity. In order to more clearly see this effect, the two reflectivity progressions from FIG. 4 are plotted in FIG. 5, normalized to the reflectivity of the respective reflective optical element having 50 bilayers. In the case of 70 bilayers, it is possible by the polishing of the individual layers of the multilayer system in the coating of the substrate to achieve a rise in reflectivity of more than 0.3%.

Figure 6:
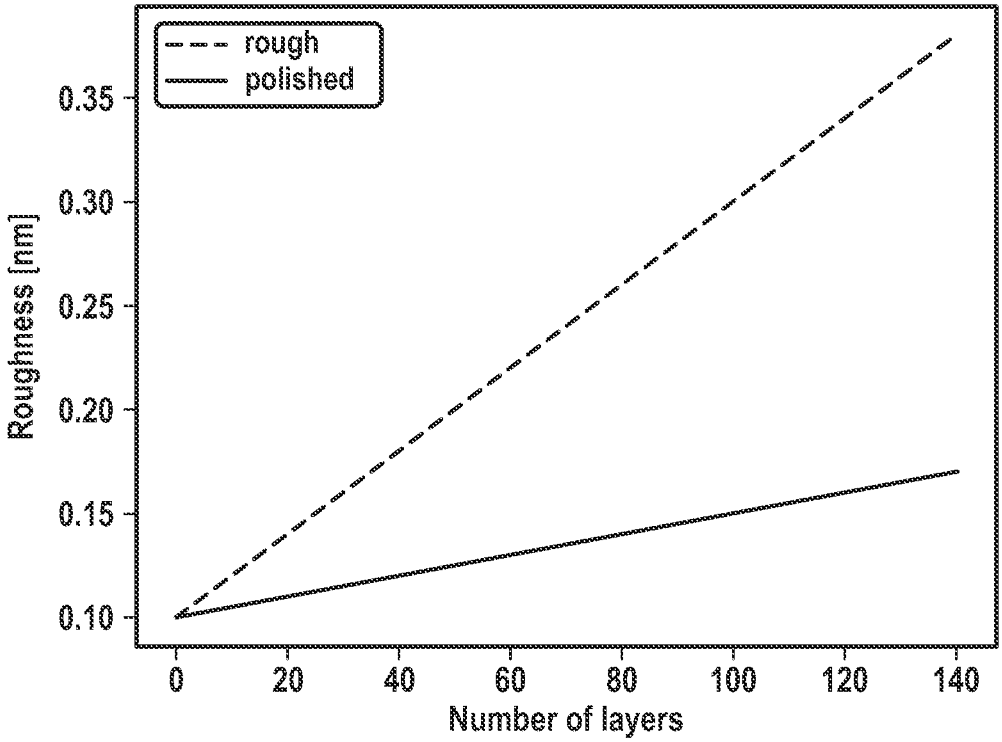
FIG. 6 is a graph illustrating roughness as a function of the number of layers for a second comparative form and a third embodiment of a reflective optical element.
Figure 7:
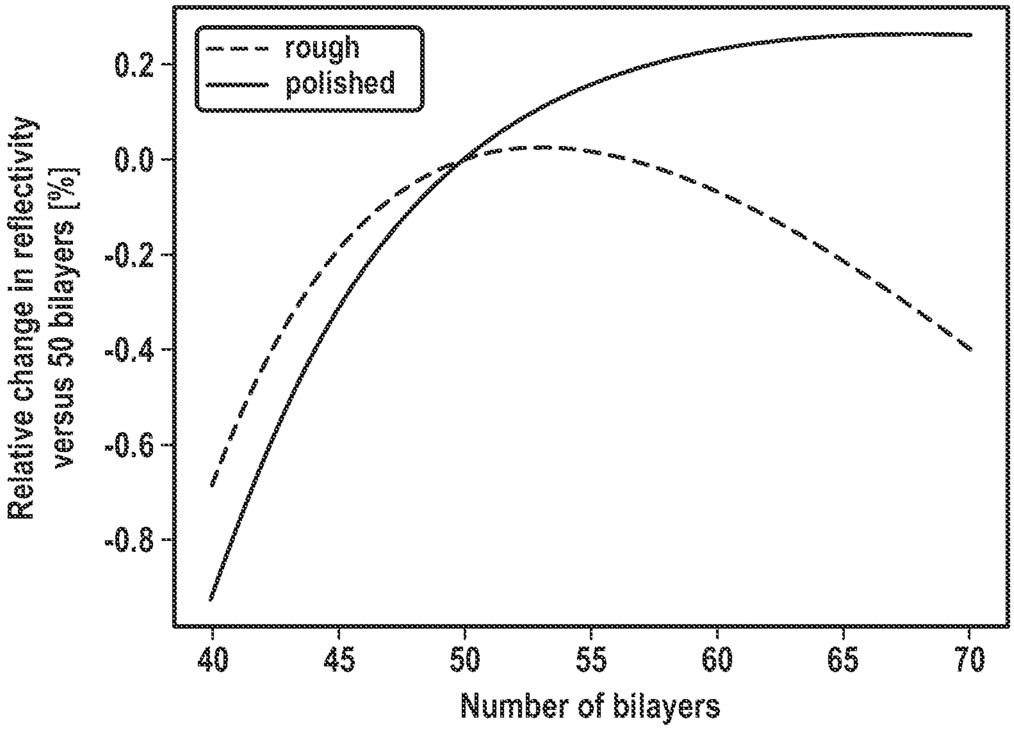
FIG. 7 is a graph illustrating the relative change in reflectivity standardized to the respective variant of the second comparative form and the third embodiment with 50 bilayers.

Correspondingly, reflective optical elements having a multilayer system that forms a reflective coating have also been examined, said multilayer system having polished layers of a roughness rising in a linear manner, but with lower slope than in the case of the reflective optical comparative elements just described that have a multilayer system having rough layers that forms a reflective coating. Both roughness progressions (dotted for reflective optical elements having unpolished layers, solid for reflective optical elements having polished layers) as a function of the number of layers are shown in FIG. 6. As apparent in FIG. 6, similar to that described with reference to FIG. 4, roughness in the reflective optical comparative elements presented here with unpolished layers (dotted line) rises from 0.10 nm on the as yet uncoated substrate surface to a value of almost 0.40 nm when a multilayer system composed of 70 bilayers has been applied to the substrate. In the case of the reflective optical elements with polished layers (solid line), roughness rises up to 0.15 nm in the case of 70 bilayers. In FIG. 7, the corresponding reflectivities in percent are plotted as a function of the number of bilayers and normalized to the reflectivity of the reflective optical element having 50 unpolished layers. Again, the reflectivity at a wavelength of 13.5 nm is that at an angle of incidence of virtually zero.

Figure 8:
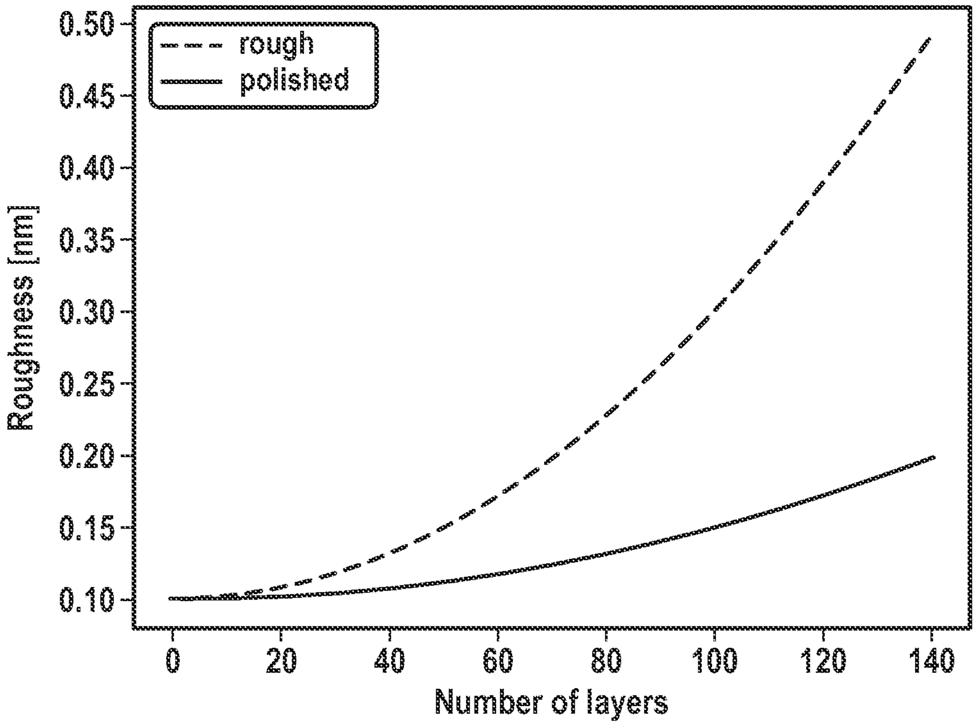
FIG. 8 is a graph illustrating roughness as a function of the number of layers for a third comparative form and a fourth embodiment of a reflective optical element.
Figure 9:
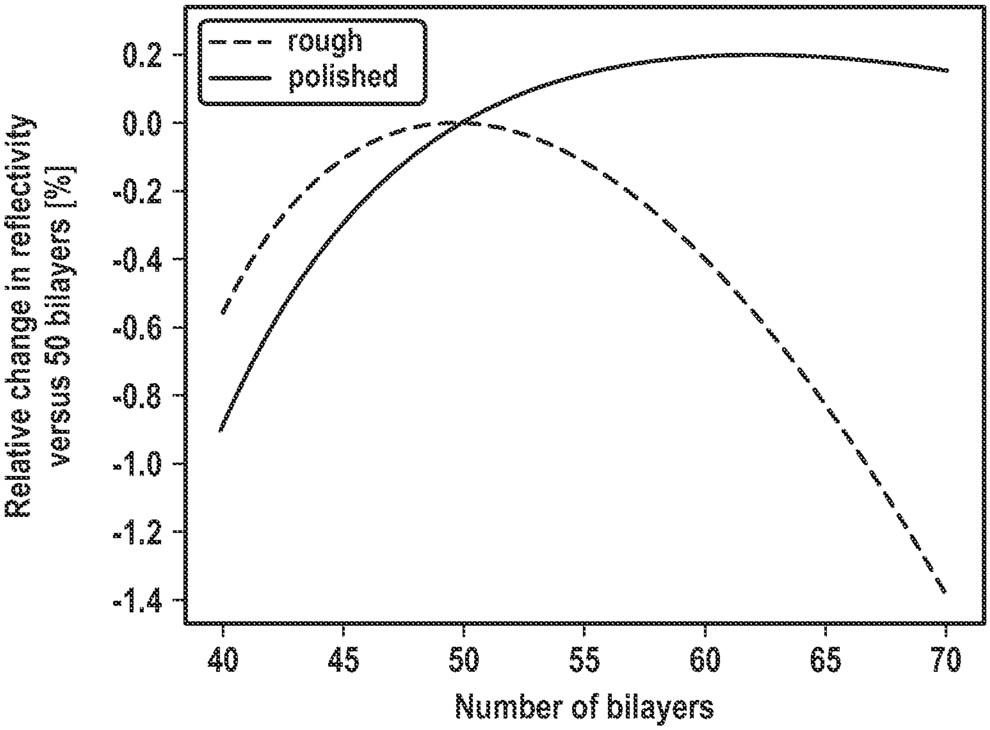
FIG. 9 is a graph illustrating the relative change in reflectivity standardized to the respective variant of the third comparative form and the fourth embodiment with 50 bilayers.

In addition, reflective optical elements having roughness rising in a quadratic manner over the number of layers have also been examined, both for reflective optical comparative elements having multilayer systems composed of rough layers and for reflective optical elements having multilayer systems composed of polished layers as a reflective coating. As apparent in FIG. 8, in which these two roughness progressions are shown, roughness in the reflective optical elements considered here with unpolished layers (dotted line) rises from 0.10 nm on the as yet uncoated substrate surface to a value of almost 0.40 nm when a multilayer system composed of 70 bilayers has been applied to the substrate. In the case of the reflective optical elements with polished layers (solid line), roughness rises up to 0.20 nm in the case of 70 bilayers. In FIG. 9, the corresponding reflectivities in percent are plotted as a function of the number of bilayers and normalized to the reflectivity of the respective reflective optical element having 50 layers. Here too, the reflectivity at a wavelength of 13.5 nm is that at an angle of incidence of virtually zero.

As apparent from FIGS. 7 and 9, even in the case of the reflective optical elements having polished layers with rising roughness, the polishing of the layers in the application of the multilayer system to the respective substrate, even over and above 50 bilayers, can achieve a greater than proportional gain in reflectivity compared to the corresponding reflective optical elements with unpolished layers, irrespective of the manner of the increase in roughness. In both the cases examined here by way of example, it is possible to achieve a rise in reflectivity of nearly 0.2% by polishing the individual layers of the multilayer system in the coating of the substrate. Especially in the range from 55 to 70 stacks, the polishing of the layers of the respective multilayer system that forms a reflective coating can achieve a significantly greater than proportional gain in reflectivity compared to the corresponding multilayer system composed of unpolished layers.

As well as the narrowband reflective optical elements having periodic multilayer systems that have just been discussed, broadband reflective optical elements having aperiodic multilayer systems have also been examined, i.e., with multilayer systems that depart in at least one stack from periodicity that is otherwise observed.

The examples shown hereinafter are reflective optical elements in which the layers of the multilayer system have a roughness that rises in a quadratic manner in the direction facing away from the substrate, with the rise in roughness being smaller than in the case of a corresponding reflective optical element composed of unpolished layers, as in the narrowband optical elements last discussed (see also FIG. 8).

Figure 10:
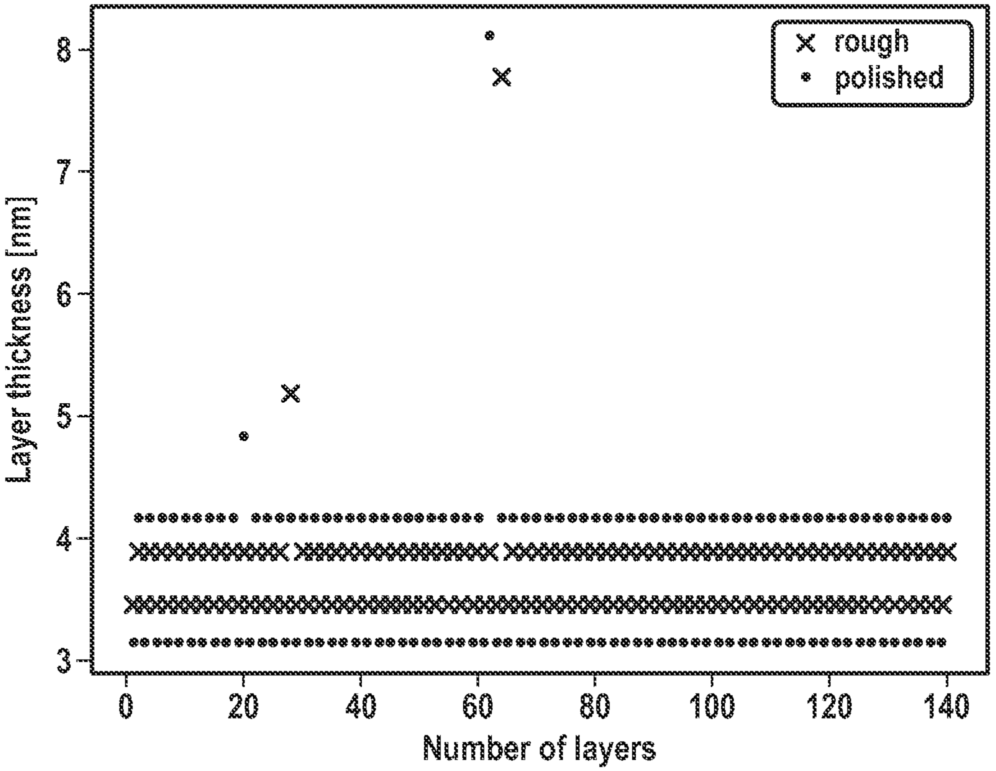
FIG. 10 is a graph illustrating the layer thicknesses of a fourth comparative form and a fifth embodiment of a reflective optical element depending on the number of layers.
Figure 11:
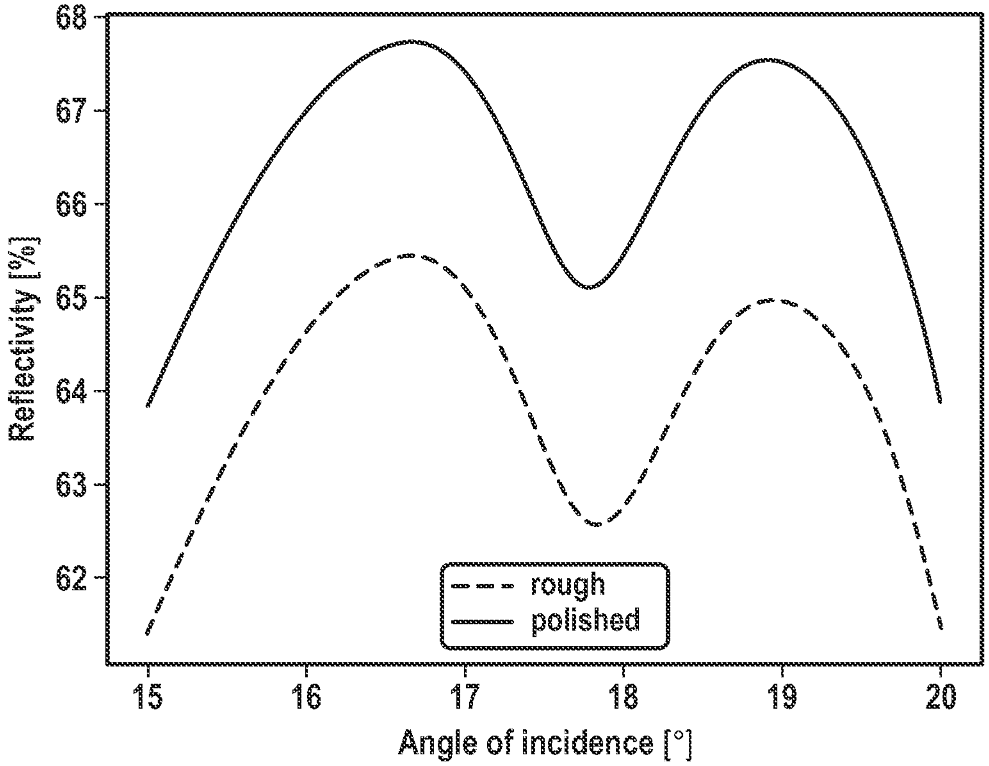
FIG. 11 is a graph illustrating the average reflectivity of the fourth comparative form and the fifth embodiment of a reflective optical element depending on the angle of incidence.

The examples illustrated in FIGS. 10 to 13 are reflective optical elements where the periodicity is broken only at particular points in the multilayer systems having optical function thereof. Both the variants with polished layers and those with unpolished layers have two stacks in which the thickness of the layer of one of the at least two materials differs by more than 10% from the thickness of the layer of that material in the respective adjacent stacks. For the examples shown here, layer thicknesses are shown as a function of the number of layers in FIG. 10. More specifically, the 70 bilayers of the optical elements associated with FIG. 10 are formed with molybdenum as the absorber and silicon as the spacer. The crosses in FIG. 10 indicate the layer thicknesses of the comparative elements with rough multilayer system as a reflective coating, and the dots indicate the layer thicknesses of the reflective optical elements with polished multilayer system as a reflective coating. In the variant examined here, the spacer layers in two stacks of each optical element have each been chosen to be thicker than in the periodic base design. In the case of 70 bilayers, shown by way of example in FIG. 10, in the polished case the different spacer layers have a thickness of 4.84 nm or 8.12 nm rather than 4.18 nm, and in the rough case a thickness of 5.20 nm or 7.79 nm rather than 3.89 nm. The resulting reflectivity in percent as a function of the angle of incidence at a wavelength of 13.5 nm over an angle range of 15° to 20° is shown in FIG. 11.

Figure 12:
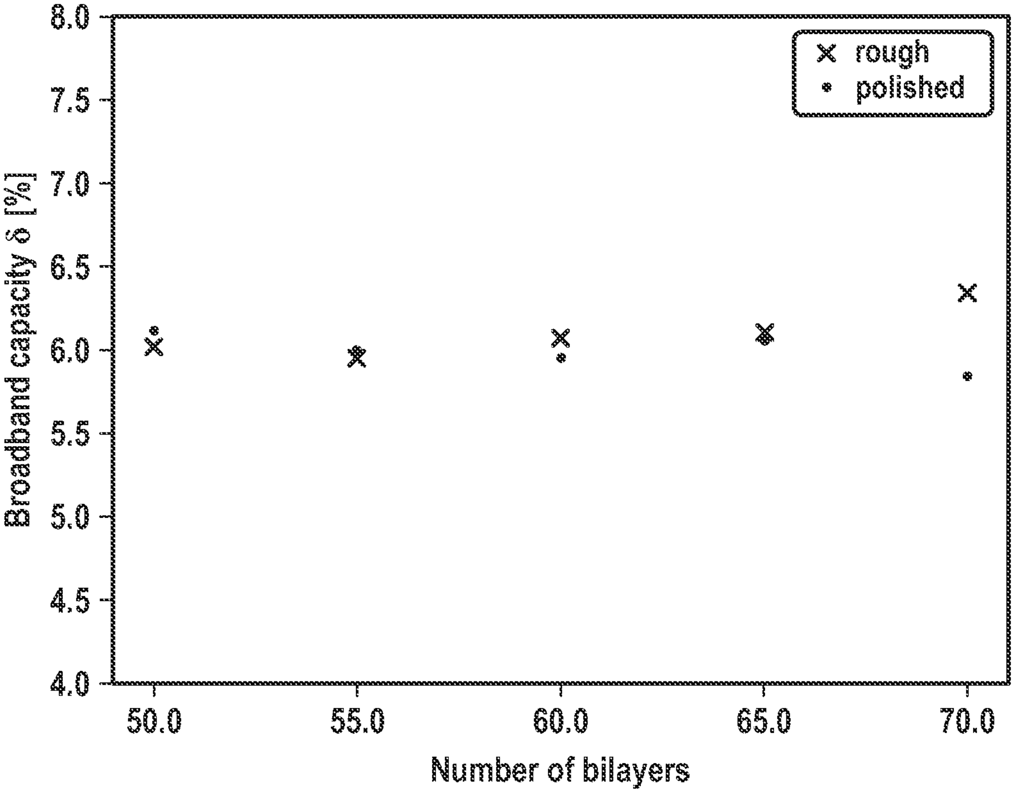
FIG. 12 is a graph illustrating the broadband capacity of variants of the fifth embodiment of a reflective optical element depending on the number of bilayers.

Corresponding reflective optical elements having 50, 55, 60 and 65 layers were also examined, but are not shown here. The broadband capacity δ thereof, defined as the quotient of the difference between maximum and minimum reflectivity on the one hand, and arithmetic average reflectivity over the entire angle range, called average reflectivity, on the other hand, is shown in FIG. 12. The smaller the δ, the greater the broadband capacity of the multilayer system. Average reflectivity is commonly cited as a measure of the reflection of a broadband reflective optical element. Since the broadband capacity δ can vary by a value of 6% for reflective optical elements having multilayer systems having 50 to 70 layers, the corresponding reflective optical elements both with rough layers (crosses) and with polished layers (dots) may be regarded as comparable. By way of comparison, it should be pointed out that, in the case of the narrowband reflective optical elements discussed in conjunction with FIGS. 8 and 9, the corresponding δ value at 12% is about twice as high.

Figure 13:
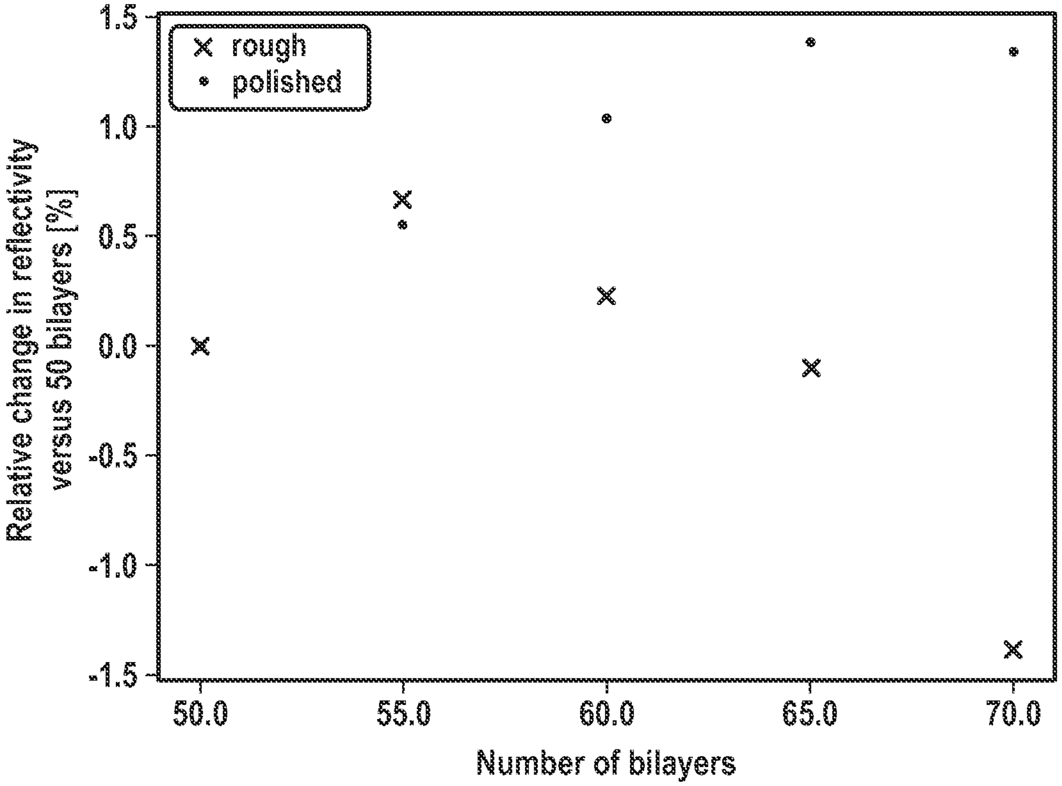
FIG. 13 is a graph illustrating the relative change in reflectivity standardized to the respective variant of the fourth comparative form and the fifth embodiment with 50 bilayers.

FIG. 13 shows, as a function of the number of bilayers, the relative change in average reflectivity of these reflective optical elements based on the average reflectivity of the respective reflective optical element having a multilayer system composed of 50 bilayers. The polishing of the layers in the production of the respective optical element achieves a greater than proportional increase in average reflectivity by up to 2.5%.

Figure 14:
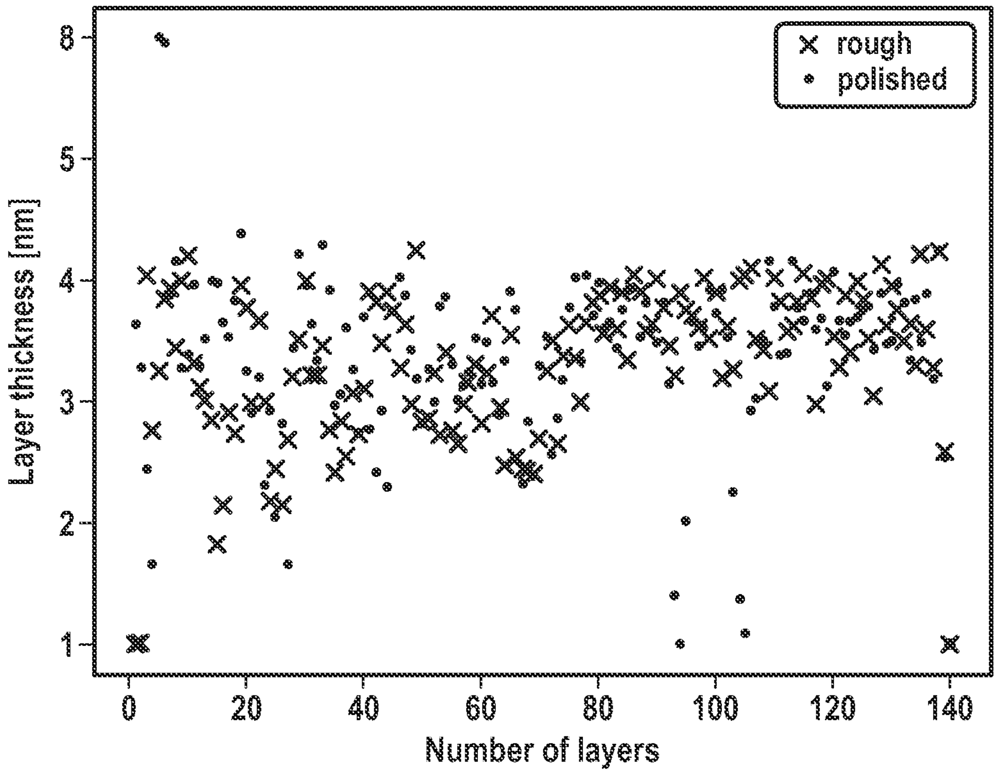
FIG. 14 is a graph illustrating the layer thicknesses of a fifth comparative form and a sixth embodiment of a reflective optical element depending on the number of layers.
Figure 15:
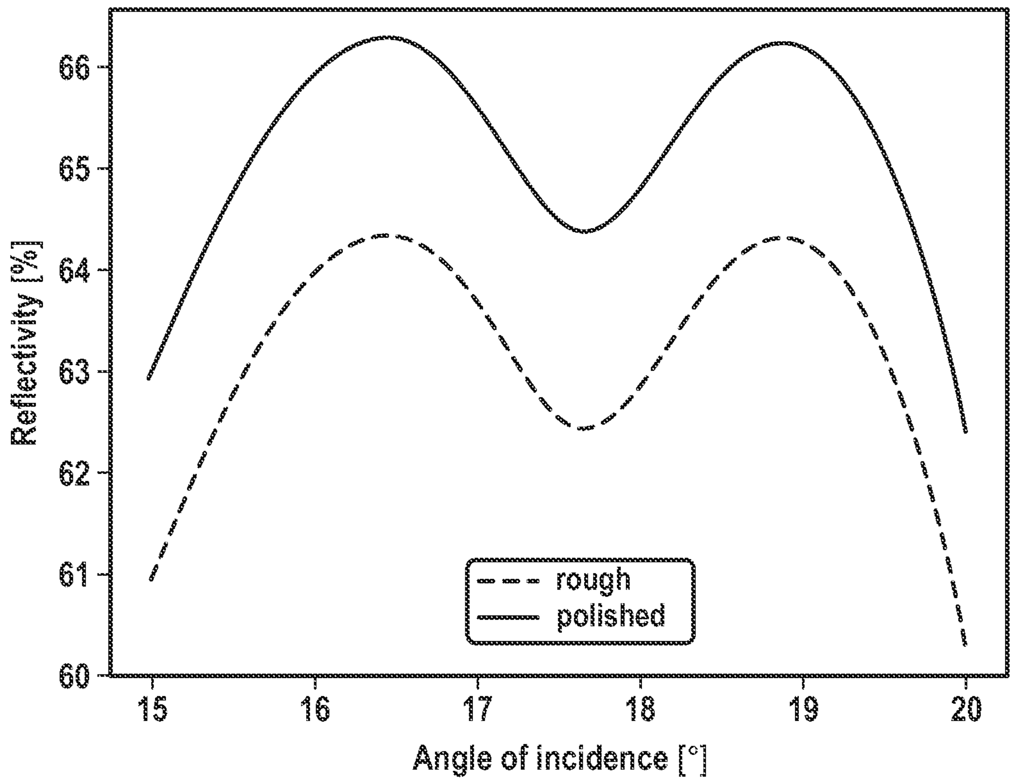
FIG. 15 is a graph illustrating the average reflectivity of the fifth comparative form and the sixth embodiment of a reflective optical element depending on the angle of incidence.
Figure 16:
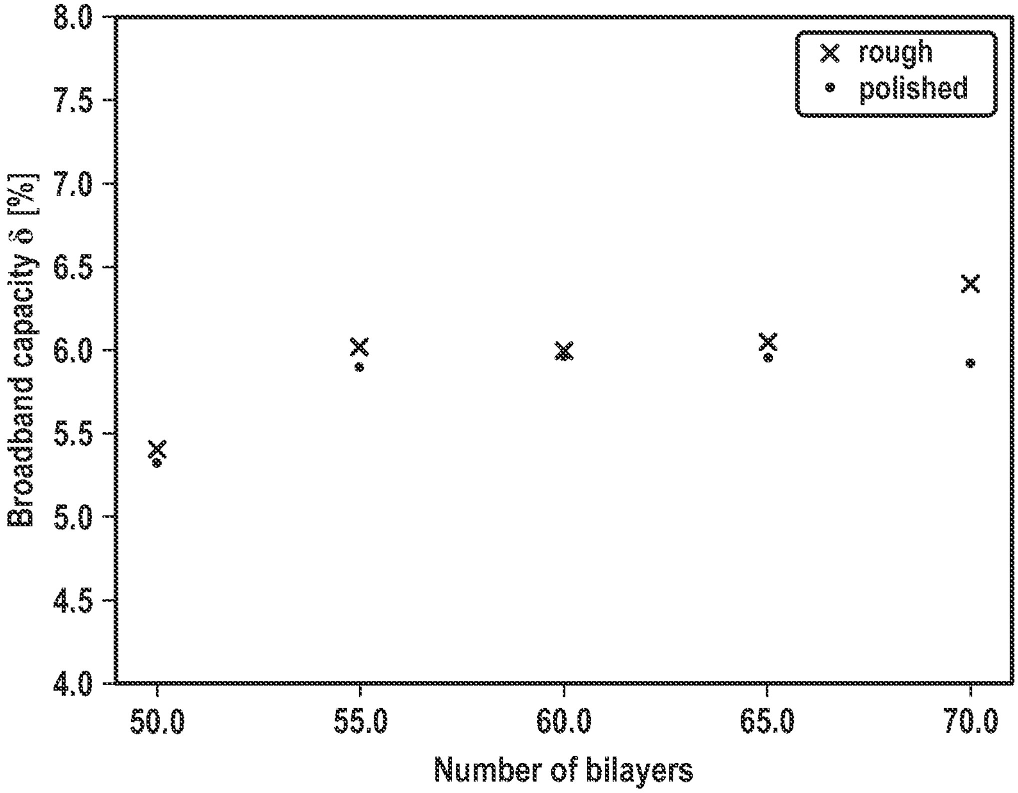
FIG. 16 is a graph illustrating the broadband capacity of variants of the sixth embodiment of a reflective optical element depending on the number of bilayers.

In addition, broadband reflective optical elements with a quadratic rise in roughness have also been examined, in which at least half of all stacks have at least one thickness of a layer of one of the at least two materials that differs by more than 10% from the thickness of the layer of the corresponding material in the respective adjacent stack(s). In the examples considered hereinafter, it was possible to choose the layer thicknesses completely freely. Thus, by contrast with the examples considered in connection with FIGS. 11 to 13, there was a maximum number of degrees of freedom in the choice of layer thickness. By way of example, FIG. 14 shows the layer thicknesses as a function of the number of layers for the respective executions with 70 bilayers. The crosses represent the layer thicknesses of the reflective optical element with rough layers, and the dots the layer thicknesses of the reflective optical element with polished layers. In much more than half of all stacks, at least one layer of one of the at least two materials has a thickness that differs by more than 10% from the thickness of the layer of the corresponding material in the respective adjacent stack(s). The resulting reflectivity in percent as a function of the angle of incidence at a wavelength of 13.5 nm over an angle range of 15° to 20° is shown in FIG. 15. The corresponding reflective optical elements having 50, 55, 60 and 65 bilayers were also examined. The broadband capacity δ for 50 to 70 bilayers is plotted in FIG. 16 with dots for the reflective optical elements having polished layers and with crosses for the reflective optical elements having unpolished layers, as a function of the number of bilayers. The values are essentially just above 6% and vary only slightly from one another, and so these different reflective optical elements can be considered to be comparable.

Figure 17:
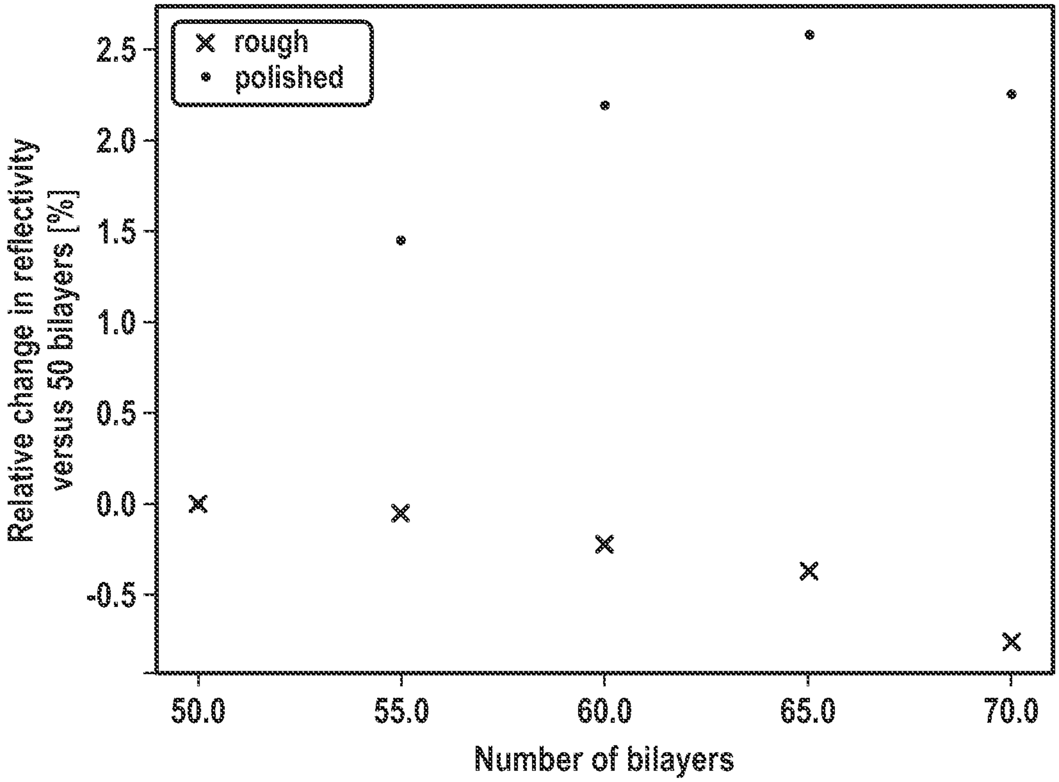
FIG. 17 is a graph illustrating the relative change in reflectivity standardized to the respective variant of the fifth comparative form and the sixth embodiment with 50 bilayers.

FIG. 17 shows, as a function of the number of bilayers, the relative change in average reflectivity of these reflective optical elements based on the average reflectivity of the reflective optical element having a multilayer system composed of 50 polished and 50 unpolished bilayers. The polishing of the layers in the production of the respective optical element achieves a greater than proportional increase in average reflectivity by up to 1.4%.

It is thus surprisingly possible in the case of broadband reflective optical elements with high numbers of stacks of especially 55 to 70 stacks, preferably 60 to 70 stacks, by the polishing of layers, preferably all layers, in the application of the respective multilayer system, to achieve a greater than proportional increase in average reflectivity which is about one order of magnitude higher than in the case of narrow-band reflective optical elements based on purely periodic multilayer systems.

A comparable result was also achieved in the case of broadband reflective optical elements in which the multilayer system was found to have fewer degrees of freedom than in the most recent examples from FIGS. 14 to 17, and in the case of broadband reflective optical elements in which the layers of the multilayer system with optical function that forms the reflective coating have a constant roughness or a roughness that decreases in the direction facing away from the substrate, or in which the layers of the multilayer system have a roughness that rises in a linear manner in the direction facing away from the substrate, with the rise in roughness being smaller than in the case of a corresponding reflective optical element having a reflective coating in the form of a multilayer system composed of unpolished layers.

Increases in reflectivity by layer polishing and increasing the number of layers were also observed in the case of reflective optical elements with multilayer systems based on ruthenium/silicon or on molybdenum/beryllium. It was also possible to detect the effect irrespective of whether layers were additionally provided in order to reduce interdiffusion between absorber and spacer layers or as protection on the vacuum-facing side of the respective multilayer system having optical function that forms a reflective coating.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. A method of producing a reflective optical element for an extreme ultraviolet wavelength range comprising:

forming a reflective coating on a substrate, wherein the reflective coating comprises:

a multilayer system having optical function, wherein the multilayer system comprises mutually alternating layers of at least two different materials with different real parts of a refractive index for each of the at least two different materials at a wavelength in the extreme ultraviolet wavelength range, wherein the multilayer system comprises more than 50 layer stacks, wherein each layer stack comprises a first layer comprised of one of the at least two different materials and layers arranged between the first layer and a second layer of the one of the at least two different materials of another layer stack that is closest to the first layer with increasing distance from the substrate, and polishing at least one layer of each layer stack of the multilayer system such that in the reflective optical element, roughness rises significantly less over all layers than in a corresponding reflective optical element with a reflective coating composed of a multilayer system of unpolished layers and such that there is a progression in roughness of polished layers in a direction facing away from the substrate.

2. The method of claim 1, wherein a first material of the at least two different materials comprises molybdenum and a second material of the at least two different materials comprises silicon.

3. The method of claim 1, wherein forming the reflective coating comprises choosing layer thicknesses of layers of the multilayer system such that a thickness of at least one layer of one of the at least two different materials in at least one layer stack differs by more than 10% from a thickness of a layer of a same material in one or more adjacent layer stacks.

4. The method of claim 1, wherein the polishing comprises polishing one layer in each layer stack.

5. The method of claim 1, wherein the polishing comprises polishing every layer of the multilayer system.

6. The method of claim 1, wherein forming the reflective coating comprises forming 55 to 70 layer stacks.

7. The method of claim 1, wherein the polishing comprises one or more of ion-assisted polishing, reactive ion-assisted polishing, plasma-assisted polishing, reactive plasma-assisted polishing, bias plasma-assisted polishing, polishing via magnetron atomization with pulsed DC current, or atomic layer polishing.

8. A reflective optical element, produced by the method of claim 1.

9. The reflective optical element of claim 8, comprising two layer stacks in which a thickness of a layer of one of the at least two different materials differs by more than 10% from a thickness of a layer of the one of the at least two different materials in an adjacent layer stack.

10. The reflective optical element of claim 8, wherein at least half of all the layer stacks have at least one thickness of a layer of one of the at least two different materials that differs by more than 10% from a thickness of a layer of the one of the at least two different materials in an adjacent layer stack.

11. The reflective optical element of claim 8, wherein the layers of the multilayer system have a constant roughness or a roughness that decreases in a direction facing away from the substrate.

12. The reflective optical element of claim 8, wherein the reflective optical element has a roughness of not more than 0.2 nm.

13. The reflective optical element of claim 8, wherein the progression in roughness increases in the direction facing away from the substrate.

14. The reflective optical element of claim 8, wherein the progression in roughness decreases in the direction facing away from the substrate.

15. The method of claim 1, wherein the progression in roughness increases in the direction facing away from the substrate.

16. The method of claim 1, wherein the progression in roughness decreases in the direction facing away from the substrate.

* * * * *